(12) United States Patent
Seok et al.

(10) Patent No.: US 9,722,108 B2
(45) Date of Patent: Aug. 1, 2017

(54) PHOTODETECTOR WITH PLASMONIC STRUCTURE AND METHOD FOR FABRICATING THE SAME

(71) Applicant: AGENCY FOR DEFENSE DEVELOPMENT, Daejeon (KR)

(72) Inventors: Chulkyun Seok, Seoul (KR); Euijoon Yoon, Seoul (KR); Yongjo Park, Yongin-si (KR); Chiyeon Kim, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 57 days.

(21) Appl. No.: 14/562,357

(22) Filed: Dec. 5, 2014

(65) Prior Publication Data

US 2016/0079452 A1  Mar. 17, 2016

(30) Foreign Application Priority Data

Sep. 17, 2014 (KR) .................. 10-2014-0123436

(51) Int. Cl.
| | |
|---|---|
| *H01L 31/0236* | (2006.01) |
| *H01L 31/18* | (2006.01) |
| *H01L 27/144* | (2006.01) |

(52) U.S. Cl.
CPC .... *H01L 31/02366* (2013.01); *H01L 27/1446* (2013.01); *H01L 31/18* (2013.01)

(58) Field of Classification Search
None
See application file for complete search history.

(56) References Cited

U.S. PATENT DOCUMENTS

| | | | | |
|---|---|---|---|---|
| 8,294,025 | B2 * | 10/2012 | Fonash | ................ B82Y 20/00 |
| | | | | 136/252 |
| 2008/0047600 | A1 * | 2/2008 | Ohashi | ............ H01L 31/03529 |
| | | | | 136/255 |
| 2011/0186119 | A1 * | 8/2011 | Atwater | ............. H01L 31/0232 |
| | | | | 136/256 |

FOREIGN PATENT DOCUMENTS

| | | |
|---|---|---|
| JP | 2012-044217 A | 3/2012 |
| KR | 10-2009-0064917 A | 6/2009 |
| KR | 10-2011-0138186 A | 12/2011 |
| KR | 10-1197575 B1 | 11/2012 |
| KR | 10-2014-0086934 A | 7/2014 |

* cited by examiner

*Primary Examiner* — Hoang-Quan Ho
(74) *Attorney, Agent, or Firm* — LRK Patent Law Firm

(57) ABSTRACT

A photodetector with a plasmon structure includes a semiconductor substrate, a plurality of light-receiving elements that are formed in a predetermined pattern, protruding from the semiconductor substrate, and a nanostructure that is placed in contact with a surface of the semiconductor substrate among the light-receiving elements and which induces a plasmon phenomenon thereon.

8 Claims, 4 Drawing Sheets

PHOTODETECTOR WITH PLASMONIC STRUCTURE AND METHOD FOR FABRICATING THE SAME

CROSS REFERENCE TO RELATED APPLICATION

This application claims the benefit of Korean Patent Application No. 10-2014-0123436, filed Sep. 17, 2014, the entire contents of which are incorporated herein by reference.

TECHNICAL FIELD

The present inventive concept relates to a photodetector exemplified by an indium antimonide (InSb) infrared sensor, and solar cells and sensors using Si or Groups II-VI, or III-V compound semiconductors. More particularly, the present inventive concept relates to a photodetector having a plasmon structure that employs a metal nanopattern capable of inducing a plasmon phenomenon to enhance sensitivity and quantum efficiency and which overcomes the problem of conventional photonic crystals.

BACKGROUND

Photodetectors are a generic name for semiconductor devices that are operated based on the theory that incident light energy is absorbed and converted into electric energy, with the concomitant generation of electrons and holes. Representative among photodetectors are solar cells and solar sensors.

Silicon is representative of Group IV elemental semiconductors while indium antimonide (InSb) and cadmium telluride (CdTe) are representative among Groups III to V and Groups II to VI compound semiconductors, respectively. Because those semiconductors have respective energy band gaps, they find applications in different fields according to wavelength of interest.

Studies have been directed toward improving the quantum efficiency of photodetectors, with T. Ebbesen as a central figure. He reported that when light is incident on a metallic thin film in which regular arrays of nanoscale apertures are formed, light with a specific wavelength band is filtered due to surface plasmon, with enhanced light transmission through the metallic film. Since the report, many similar studies have followed.

Given such a metallic nanostructure, a photodetector, however, has a significantly reduced area on which light can be incident, and greatly differs in plasmon effect according to the incident angle of light.

There is therefore a need for a method by which a plasmon structure is applied to a photodetector without the above-mentioned problems.

SUMMARY

The present inventive concept is conceived to solve the problems encountered in the background art, including a reduced light receiving area and dependency of quantum efficiency on incident light angle, and an object of the present inventive concept is to provide a photodetector employing a plasmon structure that can increase a light receiving area and can enhance quantum efficiency, and a method for fabricating the same.

Another object of the present inventive concept is to provide a photodetector having a plasmon inducing structure thereon, and a method for fabricating the same.

In order to accomplish the above-mentioned objects, the present inventive concept provides a photodetector having a metal nanopattern formed thereon that enhances quantum efficiency with regard to wavelengths of interest and which can solve the problems caused by the formation of metal nanopatterns, including a reduced light receiving area and dependency of quantum efficiency on incident light angle.

An aspect of the present inventive concept relates to a photodetector with a plasmon structure, comprising: a semiconductor substrate; a plurality of light-receiving elements that are formed in a predetermined pattern, protruding from the semiconductor substrate; and a nanostructure that is placed in contact with a surface of the semiconductor substrate among the light-receiving elements and which induces a plasmon phenomenon thereon.

In this regard, the nanostructure is a surface plasmon nanostructure.

In an embodiment, the nanostructure is made of a metallic material.

In another embodiment, the shape of the light-receiving elements in a predetermined pattern and a distance therebetween are determined according to a wavelength of interest.

In another embodiment, the light-receiving elements have different heights and shapes from each other.

In still another embodiment, each of the light-receiving elements in a predetermined pattern has a cross section having a shape selected from among a column, a triangle and an equilateral trapezoid.

In still another embodiment, the light-receiving elements are formed using MAC (Metal-Assisted-Chemical) etching.

In still another embodiment, the MAC etching is carried out in a dual-etching process composed of slow etching for forming the light-receiving elements and fast etching for forming the semiconductor substrate.

In still another embodiment, both an arrangement and a size of the nanopattern are determined according to a wavelength of interest.

An another aspect of the present inventive concept relates to a method for fabricating a photodetector with a plasmon structure, comprising: preparing a semiconductor wafer, patterning a nanostructure on the semiconductor wafer to form a nanopattern capable of inducing a plasmon phenomenon thereon; and etching the semiconductor wafer to form a plurality of light-receiving elements that protrude from the semiconductor substrate, wherein the nanostructure is placed in contact with a surface of the semiconductor substrate among the light-receiving elements.

BRIEF DESCRIPTION OF THE DRAWINGS

The above and other objects, features and advantages of the present inventive concept will be more clearly understood from the following detailed description taken in conjunction with the accompanying drawings, in which.

DETAILED DESCRIPTION

Figure 1:
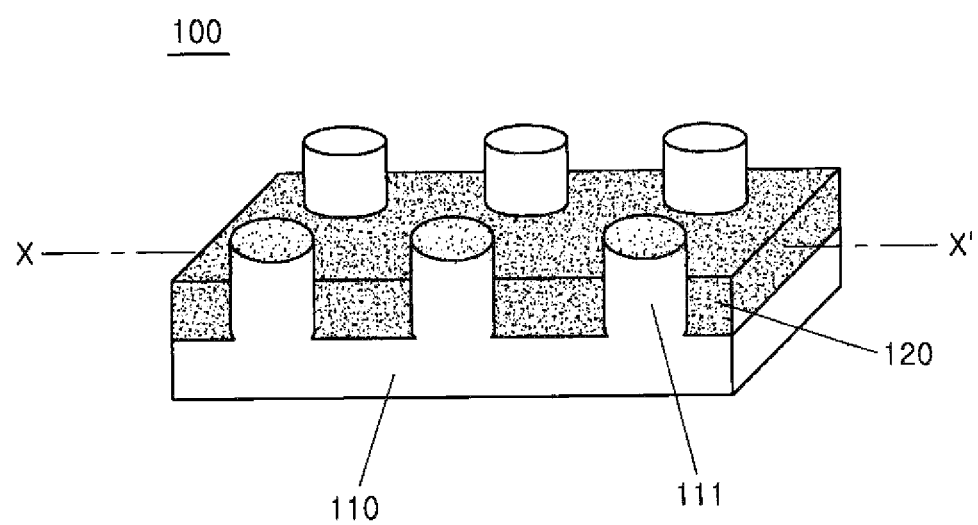
FIG. 1 is a schematic view of a photodetector having a Plasmon structure in accordance with one embodiment of the present inventive concept.

Embodiments of the present inventive concept will be described in detail with reference to the accompanying drawings. These embodiments will be described in detail in order to allow those skilled in the art to practice the present inventive concept. It should be appreciated that various embodiments of the present inventive concept are different, but are not necessarily exclusive. For example, specific shapes, configurations, and characteristics described in an embodiment of the present inventive concept may be implemented in another embodiment without departing from the spirit and the scope of the present inventive concept. In addition, it should be understood that positions and arrangements of individual components in each disclosed embodiment may be changed without departing from the spirit and the scope of the present inventive concept. Therefore, the detailed description provided below should not be construed as being restrictive. In addition, the scope of the present inventive concept is defined only by the accompanying claims and their equivalents if appropriate. The same reference numerals throughout the drawings denote elements having the same or similar function.

Therefore, in the following description of some embodiments, if the related known functions or specific instructions on configuring the gist of the present inventive concept unnecessarily obscure the gist of the invention, the detailed description thereof will be omitted.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In addition, embodiments described in the specification will be explained with reference to cross-sectional views and/or schematic views that are ideal illustrations of the present inventive concept. Hence, forms of the illustrations may be modified by preparation techniques and/or allowances.

Reference will now be made in detail to various embodiments of the present inventive concept, specific examples of which are illustrated in the accompanying drawings and described below, since the embodiments of the present inventive concept can be variously modified in many different forms. While the present inventive concept will be described in conjunction with exemplary embodiments thereof, it is to be understood that the present description is not intended to limit the present inventive concept to those exemplary embodiments. On the contrary, the present inventive concept is intended to cover not only the exemplary embodiments, but also various alternatives, modifications, equivalents and other embodiments that may be included within the spirit and scope of the present inventive concept as defined by the appended claims.

Below, a detailed description will be given of a photodetector employing a plasmon structure and a fabrication method thereof in accordance with an embodiment of the present inventive concept with reference to the accompanying drawings.

Based on the mechanism that a quantum efficiency for a wavelength of interest is enhanced by a plasmon resonance phenomenon when metal nanostructures are formed at regular sizes and/or in a regular pattern, the present inventive concept is devised to enhance the performance of a photodetector. Further, the present inventive concept is characterized in that the problems of conventional techniques, including a reduced light receiving area and angle dependency are solved by etching a semiconductor material into light-receiving elements that protrude as a column among metal nanostructures.

FIG. 1 is a schematic view of a photodetector employing a Plasmon structure according to one embodiment of the present inventive concept. Referring to FIG. 1, a photodetector 100 comprises a semiconductor substrate 110, a plurality of light-receiving elements 111 that are formed in a predetermined pattern, protruding from the semiconductor substrate 110, and a nanostructure 120 that is placed in contact with the surface of the semiconductor substrate 110 among the light-receiving elements 111 and which induces a plasmon phenomenon thereon.

The nanostructure 120 has a surface Plasmon nanostructure. Particularly, the nanostructure 120 is made of a metallic material. In addition, it is in contact with the surface of the semiconductor substrate 110 and absorbs incident light.

Materials available for the nanostructure include most general metals such as copper, nickel, etc., and some semiconductor materials (indium antimonide, indium nitride, etc.) that exhibit metal-like properties because of their very narrow energy band gap. Noble metals, such as gold, silver, platinum, etc., are also widely used to induce a Plasmon phenomenon.

Figure 2:
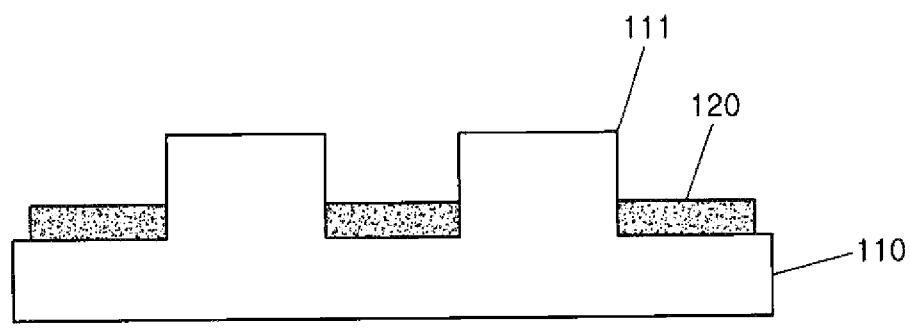
FIG. 2 is a cross sectional view of the photodetector of FIG. 1, taken along the X-X' axis.

FIG. 2 is a cross-sectional view of the photodetector of FIG. 1, taken along the X-X' axis. With reference to FIG. 2, cylindrical light-receiving elements 111 are formed in a predetermined pattern on the semiconductor substrate 110. Among the light-receiving elements 111 are formed the nanostructure 120. A predetermined pattern of the light-receiving elements 111 protrude from the upper surface of the semiconductor substrate 110 to a certain height.

This protruding structure can increase a light receiving area and can reduce the incident-angle dependency.

Figure 3:
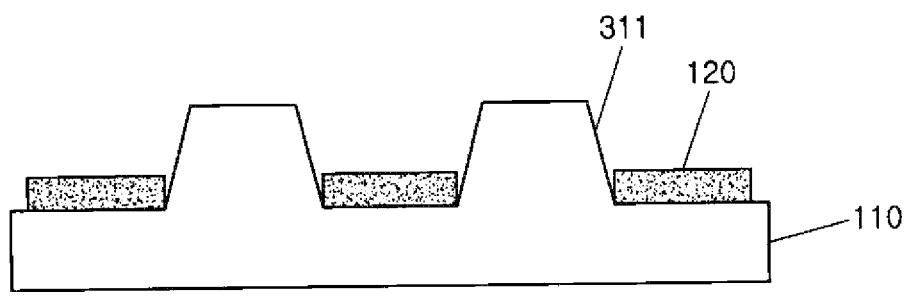
FIG. 3 is a cross sectional view of light-receiving elements the size and shape of which are designed according to a target wavelength in another embodiment of the present inventive concept.

FIG. 3 is a cross sectional view of light-receiving elements the size and shape of which are designed according to a target wavelength in another embodiment of the present inventive concept. As shown in FIG. 3, a light-receiving element 311 has an equilateral trapezoid shape. That is, the light-receiving elements 311 may be determined morphologically and dimensionally (height and size) according to a target wavelength.

Further, the arrangement, size and/or shape of the nanostructure 120, and the size and/or shape of the protruding light-receiving elements 311 may be different depending on a target wavelength. Surface plasmons are those plasmons that are confined to metal surfaces as a result of strong interaction between light and free electrons of metal, thus generating collective oscillations of the free electrons. Surface plasmons have the unique capacity to confine light to very small dimensions smaller than wavelengths at an interface between a metal and a dielectric substance, generating a strong local electromagnetic field that could enable many new applications including optical devices such as sensors. Based on these properties, the present inventive concept can enhance optical transmission through sub-wavelength holes in thick metal films. In detail, when a nanopattern in which a plurality of small holes, each having a predetermined shape (circular, rectangular, triangular, etc.) and a dimension (about ½ of the target wavelength, various dimensions can be employed according to target wavelengths), are periodically arranged in a predetermined pattern on a metal film, the metal structure acts as an antenna to greatly enhance the transmissivity due to a focusing effect.

In order to increase the intensity of local electromagnetic fields and confine light to a small area by activating surface plasmons at desired wavelengths, geometrical parameters including grating periods and aperture depths and widths of metal nanostructures on device surfaces should be adjusted according to the wavelength. Generally, nanostructures for inducing a Plasmon phenomenon are designed to have a circular shape, with a diameter of half of a target wavelength and are arranged at regular intervals twice the diameter of the target wavelength. However, the present inventive concept is not limited to this pattern.

Figure 4:
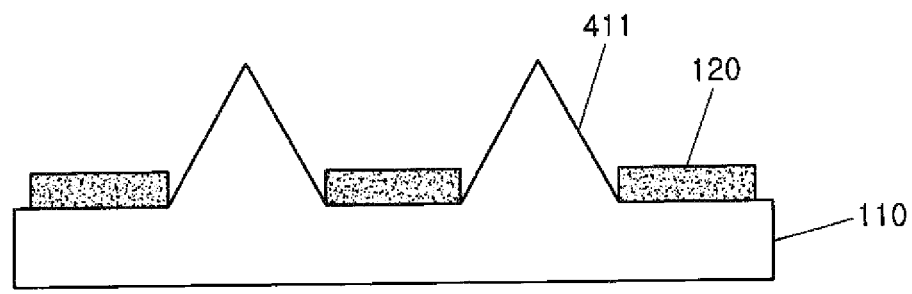
FIG. 4 is a cross sectional view of light-receiving elements the size and shape of which are designed according to a target wavelength in accordance with still another embodiment of the present inventive concept.

FIG. 4 is a cross sectional view of light-receiving elements the size and shape of which are designed according to a target wavelength in accordance with another embodiment of the present inventive concept. As shown in FIG. 4, a light-receiving element 411 has an equilateral triangle shape. That is, the light-receiving element has a shape in which two sides are equal in length and the distance therebetween is increasingly reduced as it goes from the base line to the apex.

Figure 5:
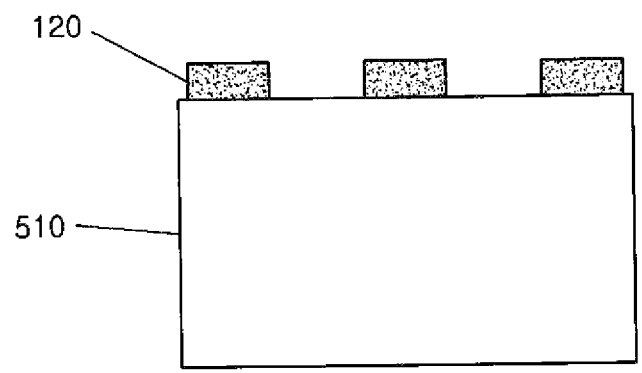
FIG. 5 is a conceptional view illustrating the preparation of a semiconductor substrate according to an embodiment of the present inventive concept.

FIG. 5 is a conceptional view illustrating the preparation of a semiconductor substrate according to an embodiment of the present inventive concept. As shown in FIG. 5, a nanostructure 120 is patterned on a semiconductor wafer 510 before etching. That is, a nanopattern is formed by patterning a nanostructure 120 on a semiconductor wafer 510.

Those available as the semiconductor wafer include Group IV elemental semiconductors typically exemplified by silicon (Si), Group III-IV compound semiconductors typically exemplified by indium antimonide (InSb), and Group II-VI compound semiconductors typically exemplified by cadmium telluride (CdTe).

Figure 6:
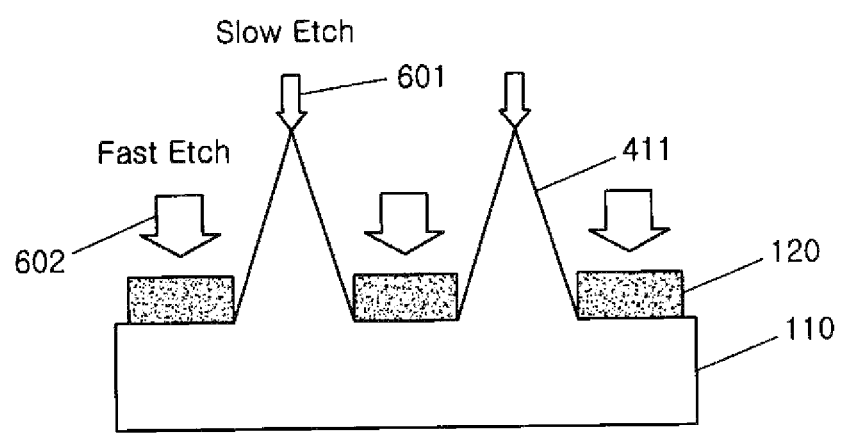
FIG. 6 is a conceptional view of an etching process for forming a lighting-receiving element 411 protruding between nanostructures in accordance with an embodiment of the present inventive concept.

FIG. 6 is a conceptional view of an etching process for forming a lighting-receiving element 411 protruding between nanostructures in accordance with an embodiment of the present inventive concept. Referring to FIG. 6, the etching process utilizes chemical etching.

On the whole, chemical etching on a semiconductor wafer starts with the oxidation of the surface of the semiconductor wafer, followed by etching the oxide film.

In accordance with one embodiment of the present inventive concept, the chemical etching may be MAC (Metal-Assisted-Chemical) etching.

In MAC etching, when a specific etchant, for example, a mixture of fluoric acid (HF) and hydrogen peroxide ($H_2O_2$) is applied to a semiconductor wafer on which a metallic material is previously patterned, the metal pattern formed as a mask catalyzes the reduction of the oxidant, which leads to promoting the dissolution of atoms of semiconductor materials near the metal pattern. The metal mask penetrates into the semiconductor substrate vertically, causing anisotropic etching. Thus, the surface of the semiconductor wafer is less prone to oxidation whereas the semiconductor wafer under the metal mask is oxidized actively. In addition, electrons that are generated upon the dissolution and etching at the interface between the metal mask and the semiconductor substrate move toward the naked semiconductor surface that is in direct contact with the etchant to prevent the oxidation and etching.

Etching is performed mainly under the metal mask (not shown) in this mechanism, forming the protruding structures as shown in FIGS. 1 to 4 in accordance with the present inventive concept.

With reference to FIG. 6, the etching according to one embodiment of the present inventive concept is composed of slow etching 601 by which etching is conducted slowly to form the light-receiving element 411, and fast etching 602 by which etching is conducted quickly to form the semiconductor substrate 110.

In detail, when a semiconductor substrate on which a metallic nanostructure is deposited is immersed in an etchant containing an oxidant and an oxide remover, selective etching and dissolution of the semiconductor substrate occurs at the interface between the metal catalyst and the semiconductor substrate, with the vertical penetration of the metal nanoparticle catalyst as MAC etching proceeds, as shown in FIG. 6. After etching, the morphology and size of the surface of the substrate resembles those of the metal nanostructure, with the metal catalyst serving as a template. By controlling the size and morphology of the metal catalyst (for example, using lithography), the finally etched structure can be given a desired shape.

On a naked surface of the semiconductor substrate, an oxidant, for example, $H_2O_2$, is very slowly reduced. Hence, the etching rate of the etchant is as negligible as in the semiconductor substrate except for the interface between the metal nanostructure and the semiconductor substrate. In contrast, the etchant is reduced at the interface between the metal nanostructure, such as Au, Ag, Pt. etc. and the semiconductor substrate as electrons are transferred thereto from a surface of the catalyst.

The electrons that reduce the etchant are generated as a result of the oxidation of atoms of the semiconductor substrate into metal ions at the interface between the metal and the semiconductor substrate. Due to this chemical reaction, fast etching occurs at a metal/semiconductor interface and slow etching at the other areas, concurrently.

As a result, the MAC etching process may be regarded as accounting for a micro galvanic cell in which a reducing reaction and an oxidizing reaction are generated concurrently. In this regard, the semiconductor material adjacent to the metal catalyst is oxidized and dissolved, with the generation of electrons, thus locally etching the substrate.

The electron transfer is accompanied by mass transfer. At an early stage of MAC etching, a porous semiconductor region is formed just below the metal catalyst, causing mass transfer.

As MAC etching proceeds, the metal catalyst penetrates into the semiconductor substrate, which is the fundamental cause of the anisotropic etching. When anisotropic etching proceeds for a predetermined period of time, a nanostructure with a high aspect ratio can be formed. The vertical length of the nanostructure can be controlled by etching time and etchant composition.

Figure 7:
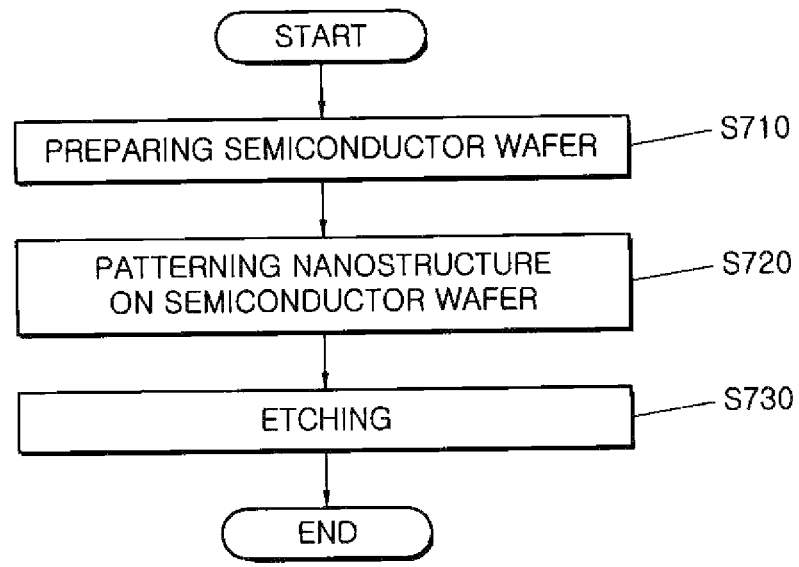
FIG. 7 is a flow chart illustrating the fabrication of a photodetector in accordance with an embodiment of the present inventive concept.

FIG. 7 is a flow chart illustrating the fabrication of a photodetector in accordance with an embodiment of the present inventive concept. As shown in FIG. 7, first, a semiconductor wafer 510 (in FIG. 5) is prepared (step S710).

A nanostructure 120 (in FIG. 5) is patterned on the semiconductor wafer 510 to form a nanopattern (step S720).

Subsequently, etching is conducted at a slow and a fast rate concurrently in the presence of a metal mask (not shown) (step S730). That is, the semiconductor wafer is immersed in a specific etchant for MAC (Metal-Assisted-Chemical) etching to form light-receiving elements 411 (in FIG. 6) that protrude from the wafer among the nanopatterns of the nanostructure 120.

As described above, the photodetector according to the present inventive concept can solve the problems encountered in conventional plasmon structures, including a reduced light receiving area and quantum efficiency dependency on incident angles, and can enhance the quantum efficiency of light receiving elements.

In addition, the fabrication method of the present inventive concept is very simple and effectively allows for the formation of a desired structure. Therefore, it is of significance in terms of mass scale production.

Although the preferred embodiment(s) of the present inventive concept have(has) been disclosed for illustrative purposes, those skilled in the art will appreciate that various modifications, additions and substitutions are possible, without departing from the scope and spirit of the invention as disclosed in the accompanying claims.

What is claimed is:

1. A photodetector with a plasmon structure, comprising:
   a semiconductor substrate, wherein the semiconductor substrate has a substantially flat bottom surface;
   a plurality of light-receiving elements that are formed in a predetermined pattern, protruding from the semiconductor substrate; and
   a nanostructure that is placed in contact with a surface of the semiconductor substrate among the light-receiving elements and which induces a plasmon phenomenon thereon,
   wherein the nanostructure is a surface plasmon nanostructure and the plurality of light-receiving elements are protruded over the nanostructure which is patterned before etching.

2. The photodetector of claim 1, wherein the nanostructure is made of a metallic material.

3. The photodetector of claim 1, wherein a shape of the light-receiving elements in a predetermined pattern and a distance therebetween are determined according to a wavelength of interest.

4. The photodetector of claim 1, wherein the light-receiving elements have different heights and shapes.

5. The photodetector of claim 1, wherein each of the light receiving elements in a predetermined pattern has a cross section having a shape selected from among a column, a triangle and an equilateral trapezoid.

6. The photodetector of claim 1, wherein the light-receiving elements are formed using MAC (Metal-Assisted-Chemical) etching.

7. The photodetector of claim 6, wherein the MAC etching is carried out in a dual-etching process composed of slow etching for forming the light-receiving elements and fast etching for forming the semiconductor substrate.

8. The photodetector of claim 1, wherein both an arrangement and a size of the nanopattern are determined according to a wavelength of interest.

* * * * *